(12) United States Patent
Lee et al.

(10) Patent No.: US 9,995,461 B2
(45) Date of Patent: Jun. 12, 2018

(54) OPTICAL LENS, LIGHT EMITTING DEVICE, AND LIGHTING DEVICE

(71) Applicant: LG INNOTEK CO., LTD., Seoul (KR)

(72) Inventors: Chang Hyuck Lee, Seoul (KR); Hyun Ho Choi, Seoul (KR); Leeim Kang, Seoul (KR); Chang Gyun Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 98 days.

(21) Appl. No.: 14/228,502

(22) Filed: Mar. 28, 2014

(65) Prior Publication Data
US 2014/0293582 A1 Oct. 2, 2014

(30) Foreign Application Priority Data

Mar. 28, 2013 (KR) ........................ 10-2013-0033374

(51) Int. Cl.
*F21V 13/04* (2006.01)
*F21V 5/04* (2006.01)
(Continued)

(52) U.S. Cl.
CPC ................ *F21V 13/04* (2013.01); *F21V 5/04* (2013.01); *G02B 19/0028* (2013.01);
(Continued)

(58) Field of Classification Search
CPC . F21V 13/04; F21V 5/007; F21V 5/04; F21V 5/046; F21V 7/0091; G02B 19/0028; G02B 19/0061; G02B 5/0257
See application file for complete search history.

(56) References Cited

U.S. PATENT DOCUMENTS 7,602,559 B2   10/2009   Jang et al.
7,738,189 B2    6/2010   Park et al.
(Continued)

FOREIGN PATENT DOCUMENTS

CN       1854770      11/2006
CN     101490465       7/2009
(Continued)

OTHER PUBLICATIONS

US 8,567,998, 10/2013, Yoon et al. (withdrawn)
(Continued)

*Primary Examiner* — Jong-Suk (James) Lee
*Assistant Examiner* — Colin Cattanach
(74) *Attorney, Agent, or Firm* — Ked & Associates LLP

(57) ABSTRACT

An optical lens, light emitting device, and lighting device are provided. The optical lens may include a first surface, a second surface disposed over the first surface, a third surface concaved with respect to the second surface towards the first surface, wherein the third surface converges toward a center thereof with a curved shape, and wherein a predetermined distance is provided between the third surface and the first surface along an optical axis, which is a straight line that passes through the center of the third surface and a center of the first surface, a protruder centrally arranged with respect to the first surface and that protrudes in a first direction along the optical axis, wherein a cross-section of the protruder taken along the optical axis includes two curved portions that each curve in the first direction and then curve in a second direction opposite to the first direction to substantially meet at the optical axis, and a plurality of supports that extend from the first surface in the first direction, and configured to provide a space below the protruder, wherein the plurality of supports is provided adjacent to the protruder.

15 Claims, 10 Drawing Sheets

(51) Int. Cl.
  *G02B 19/00*   (2006.01)
  *G02F 1/1335*  (2006.01)
  *H01L 33/58*   (2010.01)
(52) U.S. Cl.
  CPC .... *G02B 19/0061* (2013.01); *G02F 1/133603* (2013.01); *G02F 2001/133607* (2013.01); *H01L 33/58* (2013.01)

(56) References Cited

U.S. PATENT DOCUMENTS

| | | | |
|---|---|---|---|
| D632,834 S * | 2/2011 | Kon | D26/124 |
| 8,118,457 B2 * | 2/2012 | Kanai | F21V 5/04 |
| | | | 362/327 |
| 8,508,689 B2 | 8/2013 | Kuwaharada et al. | |
| 8,613,532 B2 * | 12/2013 | Fujii | G02B 27/0955 |
| | | | 362/311.02 |
| 8,622,594 B2 | 1/2014 | Ishio et al. | |
| 8,641,238 B2 | 2/2014 | Chiu et al. | |
| 9,068,715 B2 * | 6/2015 | Van Der Sijde | F21S 8/04 |
| 2002/0163808 A1 * | 11/2002 | West | F21V 5/04 |
| | | | 362/255 |
| 2002/0163810 A1 * | 11/2002 | West | G02B 19/0061 |
| | | | 362/307 |
| 2006/0238884 A1 * | 10/2006 | Jang | F21V 5/04 |
| | | | 359/653 |
| 2007/0030572 A1 * | 2/2007 | Lee | G02B 19/0071 |
| | | | 359/642 |
| 2008/0151551 A1 * | 6/2008 | Yang | F21V 5/046 |
| | | | 362/308 |
| 2008/0310159 A1 * | 12/2008 | Chinniah | F21S 48/1154 |
| | | | 362/244 |
| 2009/0129097 A1 * | 5/2009 | Ewert | B29C 45/0025 |
| | | | 362/328 |
| 2011/0044053 A1 | 2/2011 | Yamaguchi | |
| 2011/0157898 A1 * | 6/2011 | Kanai | F21V 5/04 |
| | | | 362/296.05 |
| 2011/0205744 A1 | 8/2011 | Kim | |
| 2011/0222294 A1 * | 9/2011 | Fan | F21V 5/04 |
| | | | 362/296.01 |
| 2011/0273882 A1 * | 11/2011 | Pickard | F21K 9/00 |
| | | | 362/237 |
| 2012/0250331 A1 * | 10/2012 | De Lamberterie | F21S 48/1154 |
| | | | 362/311.1 |
| 2013/0088857 A1 * | 4/2013 | Lee | G02B 19/0028 |
| | | | 362/97.1 |
| 2014/0056007 A1 * | 2/2014 | Chou | F21V 13/04 |
| | | | 362/308 |
| 2014/0126222 A1 * | 5/2014 | Wang | F21V 5/046 |
| | | | 362/311.09 |
| 2014/0167594 A1 * | 6/2014 | Kim | G02B 19/0071 |
| | | | 313/113 |
| 2015/0077976 A1 * | 3/2015 | Jiang | F21V 5/04 |
| | | | 362/97.2 |
| 2015/0117016 A1 * | 4/2015 | Kim | F21V 5/045 |
| | | | 362/293 |
| 2015/0192255 A1 * | 7/2015 | Kim | H01L 33/58 |
| | | | 362/293 |

FOREIGN PATENT DOCUMENTS

| | | | | |
|---|---|---|---|---|
| DE | 10 2005 019 832 A1 | 9/2006 | | |
| EP | 1 376 708 | 11/2011 | | |
| JP | 2004-349251 | 12/2004 | | |
| JP | 2006-093148 | 4/2006 | | |
| JP | 2006-093470 | 4/2006 | | |
| JP | 2006-309242 | 11/2006 | | |
| JP | 2007-139937 | 6/2007 | | |
| JP | 2008-186742 | 8/2008 | | |
| JP | 2010-152282 A | 7/2010 | | |
| JP | 2011-044610 A | 3/2011 | | |
| JP | 2011-095759 | 5/2011 | | |
| JP | 5150047 | 12/2012 | | |
| JP | 2013-12417 A | 1/2013 | | |
| JP | 2013-12632 A | 1/2013 | | |
| KR | 10-2006-0034021 A | 4/2006 | | |
| KR | 10-2006-0112113 A | 10/2006 | | |
| KR | 10-0713582 | 4/2007 | | |
| KR | 10-2011-0138966 | 12/2011 | | |
| KR | 10-2013-0003853 | 1/2013 | | |
| KR | 10-1287023 | 7/2013 | | |
| TW | 200827617 | 7/2008 | | |
| TW | 201120377 | 6/2011 | | |
| WO | WO 2008/007492 A1 | 1/2008 | | |
| WO | WO 2008007492 A1 * | 1/2008 | | H01L 33/58 |
| WO | WO 2011010535 A1 * | 1/2011 | | F21K 9/232 |
| WO | WO 2011055467 A1 * | 5/2011 | | F21V 5/04 |
| WO | WO 2012/004975 A1 | 1/2012 | | |
| WO | WO 2013/081417 | 6/2013 | | |
| WO | WO 2014060944 A1 * | 4/2014 | | G02B 5/045 |

OTHER PUBLICATIONS

Machine translation of WO 2011/010535 A1 retrieved from Google Patents.*
Korean Office Action dated Jun. 18, 2014, issued in Application No. 10-2013-0079162.
Korean Office Action dated Jul. 11, 2014, issued in Application No. 10-2013-0082795.
Korean Office Action dated Jun. 20, 2014 issued in Application Serial No. 10-2013-0033374.
European Search Report dated Jul. 1, 2014 issued in Application Serial No. 14162193.8.
U.S. Appl. No. 14/274,934, filed May 12, 2014.
Korean Office Action dated Oct. 16, 2014 (10-2013-0079162).
European Search Report dated Oct. 28, 2014 (14173733.8-1562).
Chinese Office Action dated Mar. 12, 2018.

* cited by examiner

OPTICAL LENS, LIGHT EMITTING DEVICE, AND LIGHTING DEVICE

CROSS-REFERENCE TO RELATED APPLICATION(S)

Pursuant to 35 U.S.C. § 119 (a), this application claims priority to Korean Patent Application No. 10-2013-0033374, filed in Korea on Mar. 28, 2013, the contents of which are hereby incorporated by reference in their entirety.

BACKGROUND

1. Field

An optical lens, light emitting device, and lighting device are disclosed herein.

2. Background

Recently, brisk technical development capable of displaying information in an image has been under way. A representative display device, a Liquid Crystal Display (LCD), may include a display substrate and a backlight assembly configured to provide light to the display substrate. The LCD may display an image using light generated from a backlight, and therefore, the backlight may play an important role in realizing a high quality image on the LCD. The backlight may be a line light source, such as a Cold Cathode Fluorescent Lamp (CCFL), a point light source, such as a light emitting diode, or a surface light source configured to generate light in the form of a surface, for example.

Conventional LCDs have largely used the CCFL, but recently, a LCD using light generated from a light emitting diode has been widely used. The light emitting diode has an advantage of low power consumption and high luminance, but has a disadvantage of low uniformity in luminance.

The light emitting diode may be arranged with a light diffusion or optical lens configured to diffuse light generated by the light emitting diode in order to enhance the luminance uniformity of light by the light emitting diode. A conventional light diffusion lens can enhance the brightness uniformity by diffusing the light emitted by the light diffusion lens, only when an angle of light emitted by being refracted from a surface of the light diffusion lens is greater than an angle of light generated by the light emitting diode and passing through an interior of the light diffusion lens.

However, in order to make the angle of light emitted by being refracted from the surface of the light diffusion lens greater than the angle of light generated by the light emitting diode and passing through the interior of the light diffusion lens, the conventional light diffusion lens suffers from disadvantages in diffusing light using the refraction because a height and size of the light diffusion lens increases.

BRIEF DESCRIPTION OF THE DRAWINGS

Embodiments will be described in detail with reference to the following drawings in which like reference numerals refer to like elements, and wherein.

DETAILED DESCRIPTION

Figure 1:
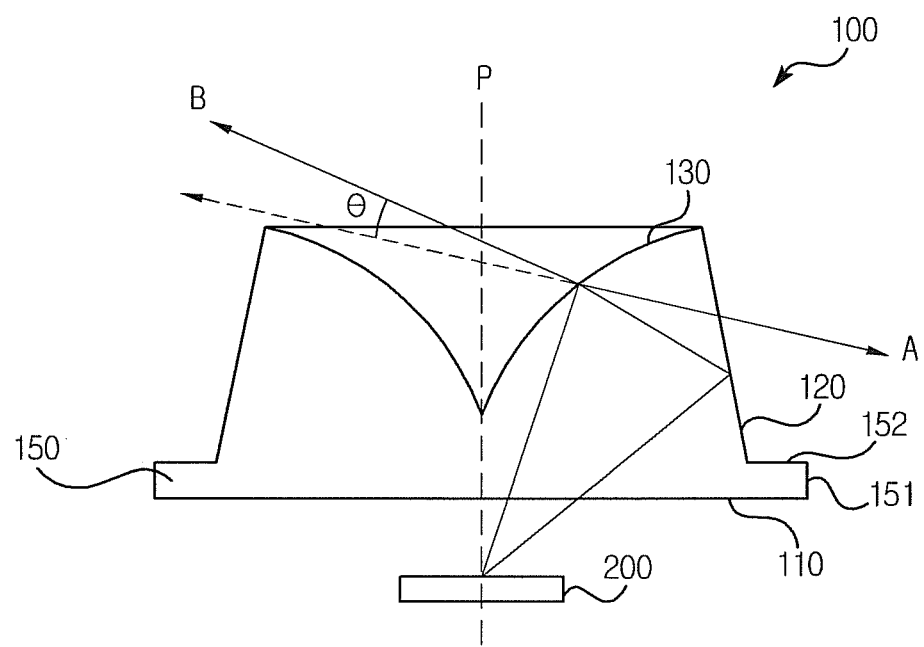
FIG. 1 is a schematic cross-sectional view of an optical lens according to an embodiment.

Embodiments will be described in detail with reference to the accompanying drawings. Where possible, like reference numerals have been used to indicate like elements, and repetitive disclosure has been omitted.

In describing embodiments, certain layers, sizes, shapes, components or features may be exaggerated for clarity and convenience. Accordingly, the meaning of specific terms or words used should not be limited to the literal or commonly employed sense, but should be construed or may be different in accordance with the intention of a user or an operator and customary usages. Therefore, the definition of the specific terms or words should be based on the contents across the specification.

FIG. 1 is a schematic cross-sectional view of an optical lens according to an embodiment. An optical lens 100 may include a first surface 110, a second surface 120, and a third surface 130. That is, the optical lens 100 may include the first surface 110 to receive light from a light source, the second surface 120 connected to the first surface 120 to reflect light received from the first surface 110, and the third surface 130 connected to the second surface 120, concaved and narrowed at a center to reflect light received from the first surface 110. The light reflected from the second surface 120 may be emitted by being refracted by the third surface 130, and the light reflected from the third surface 130 may be emitted by being refracted by the second surface 120.

The first surface 110 may be incident with light generated by a light emitter 200. Further, the first surface 110 may have a planar surface according to the embodiment of FIG. 1.

The second surface 120 may be formed with a curved surface or a planar surface and be connected to the first surface 110. Further, the second surface 120 may be slanted relative to the first surface 110. Most of the light incident on the first surface 110 may be emitted through the second surface 120. The reason the second surface 120 is slanted relative to the first surface 110 is to reduce a height and size of the optical lens 100 by allowing a portion of the light received from the first surface 110 to be reflected from the second surface 120 and to improve a luminance uniformity of light emitted from the optical lens 100.

The third surface 130 may be connected to the second surface 120, and may be formed opposite to the first surface 110. The third surface 130 may be concaved and narrowed toward a center thereof, and may have a curved shape when viewed in cross-section. That is, referring to FIG. 1, the third surface 130 may be concaved and narrowed toward an optical axis P, and may have a curved shape when viewed in cross-section.

The light reflected from the second surface 120 may be refracted by the third surface 130 to be emitted outside of the optical lens 100 and proceed along a path B, and the light reflected from the third surface 130 may be refracted by the second surface 120 to be emitted outside of the optical lens 100 and proceed along a path A. The light proceeding along the path A and the light proceeding along the path B may be opposite in proceeding direction, and a light quantity ratio may be in the range of approximately 4:1~1:4.

An angle (θ) formed between an extended line of light emitted along the path A and light proceeding along the path B may be an acute angle (θ) within approximately 20 degrees, which may remove a shadow by allowing light to proceed away from the lens through a reflection surface in a Back Light Unit (BLU) structure formed with the reflection surface adjacent the optical lens, and may reduce a width of angle of beam spread to form a broader illumination surface. When the angle (θ) formed between an extended line of light emitted along the path A and light proceeding along the path B deviates from the acute angle (θ) within approximately 20 degrees, the shadow may remain decreasing optical characteristics.

Further, the optical lens according to embodiments may be configured to have a path where light incident on a bottom surface (first surface) may be reflected from an upper surface (third surface) to proceed by being refracted by a lateral surface (second surface), and a path where light may be reflected from the lateral surface to proceed by being refracted by the upper surface, whereby uniformity of luminance may be enhanced when applied to a back light.

The optical lens 100 may include a flange 150. The flange 150 may include a fourth surface 151 that extends from the first surface 110 and a fifth surface 152 that extends from the fourth surface 151 toward the second surface 120.

Figure 2A:
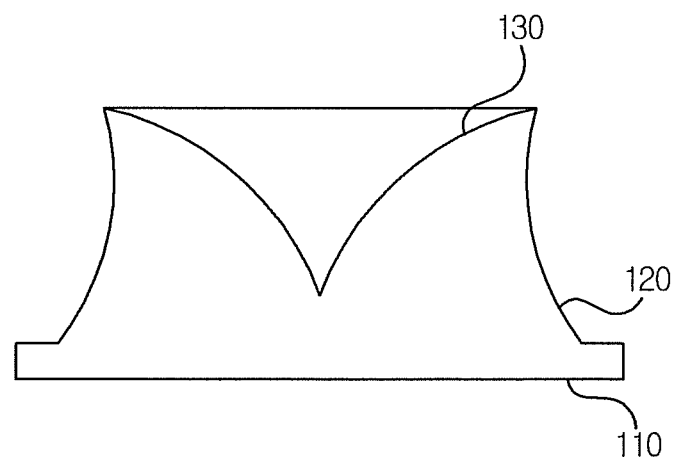
FIGS. 2A, 2B and 2C are schematic cross-sectional views of an optical lens according to embodiments.
Figure 2B:
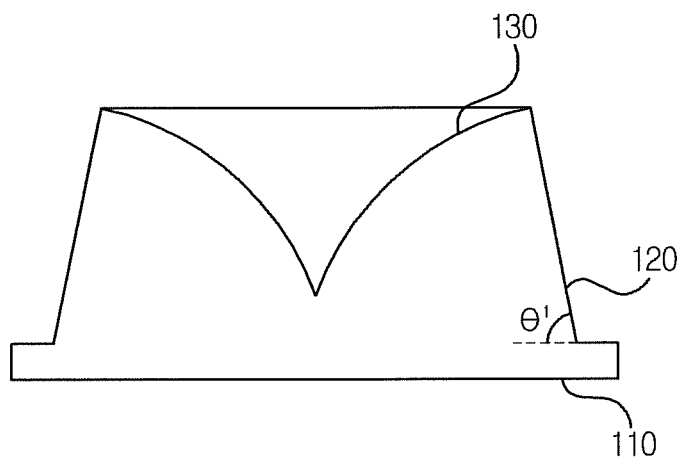
Figure 2C:
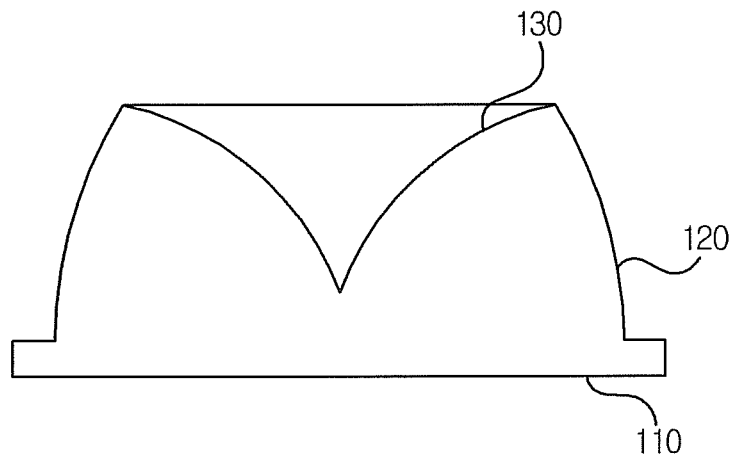
Figure 3:
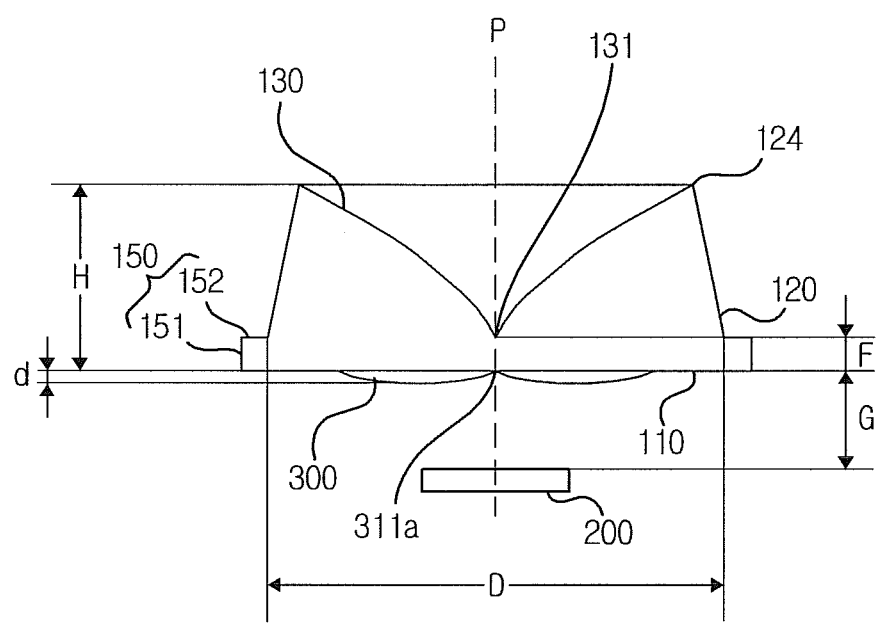
FIG. 3 is a schematic cross-sectional view of a protruder formed on an optical lens according to an embodiment.

FIGS. 2A, 2B and 2C are schematic cross-sectional views of portions of an optical lens according to embodiments. FIG. 3 is a schematic cross-sectional view of a protruder formed on an optical lens according to an embodiment.

The second surface 120, which may be a lateral surface of the optical lens, may include any one of a concave curved surface, as illustrated in FIG. 2A, a convex curved surface, as in illustrated FIG. 2C, and a planar surface, as illustrated in FIG. 2B. When the second surface 120 is a planar surface as in FIG. 2B, the second surface 120 may be slanted at a predetermined angle (θ') relative to the first surface 110.

Further, the first surface 110 of the optical lens according to embodiments may be provided with a protruder 300 configured to limit distribution of light incident on the first surface 110. Referring to FIG. 3, the protruder 300 according to embodiments may be centrally concaved and spaced apart from the light emitter 200 at a predetermined distance G. The protruder 300 may satisfy the following Equation 1, where a distance between a center 131 of the third surface 130 and a center 311a of the protruder 300 is defined as F:

$$1:0.0 \leq H:F \leq 1:1.5 \qquad \text{[Equation 1]}$$

where, H is a height of the optical lens 100.

Further, a concaved depth (H-F) at the center 131 of the third lens surface 130 may be changed depending on manufacturing conditions to mold the optical lens 100. Furthermore, an area where the center 311a of the protruder 300 and the center 131 of the third surface 130 abut or contact may be provided formed with a hole or recess.

The protruder 300 may be defined by a surface incident by light emitted from the light emitter 200. The protruder 300 may include a caved-in center toward the third surface 130. A ratio between a width D of the optical lens 100 and a depth d of the caved-in center 311a of the protruder 300 may satisfy the following Equation 2:

$$1:0.01 \leq D:d \leq 1:0.15 \qquad \text{[Equation 2]}$$

As is apparent from the foregoing, when the ratio between the width D of the optical lens 100 and the depth d of the caved-in center 311a of the protruder 300 satisfies Equation 2, a density of light incident on the center of the third surface 130 may be decreased to solve a problem of the light control in a vicinity of an outer rim 124. Also, it is possible to implement a lens design having an optimized efficiency for various light emission distributions of the light emitter 200.

Figure 4A:
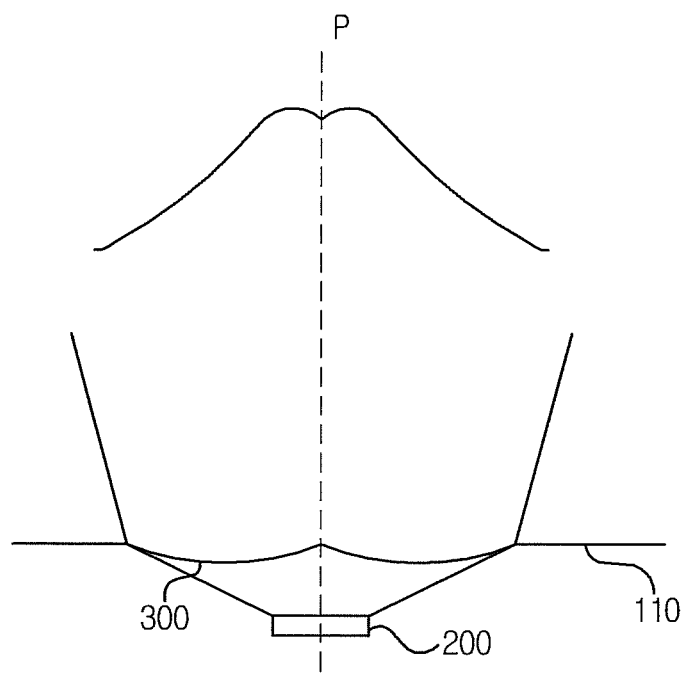
FIGS. 4A and 4B are schematic views explaining changes in light distribution for an optical lens having a protruder according to embodiments.
Figure 4B:
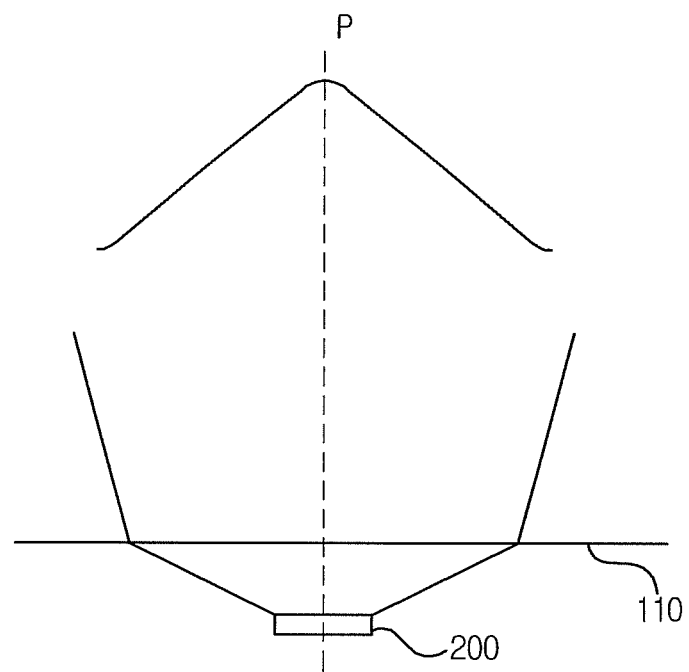
Figure 5:
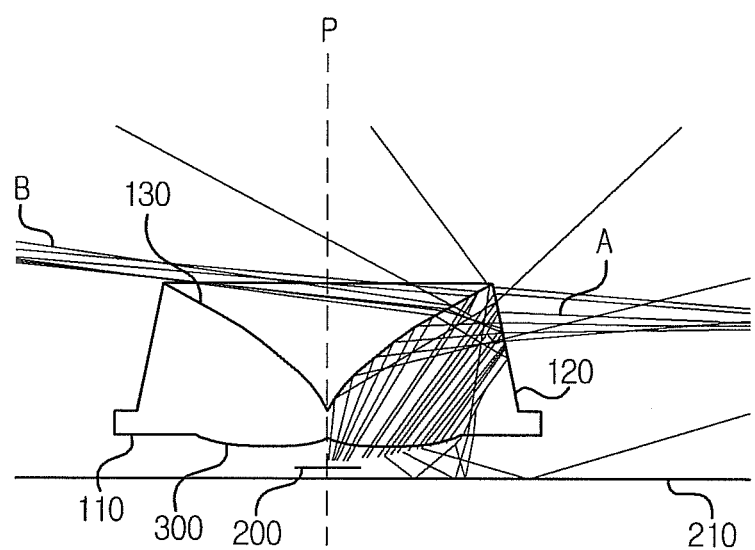
FIG. 5 is a schematic view illustrating a light profile of an optical device having a protruder according to an embodiment.

FIGS. 4A and 4B are schematic views explaining changes in light distribution for an optical lens having a protruder according to embodiments. FIG. 5 is a schematic view illustrating an optical lens having a protruder according to an embodiment. FIGS. 6A to 6F are partial cross-sectional views illustrating a shape of a protruder according to embodiments.

As discussed above, the protruder 300 may be provided for the optical lens 100 to provide adequate or desired light distribution inside the optical lens 100 and control of light emitted from the optical lens 100. FIG. 4B illustrates light output where the protruder 300 is not formed on the first surface 110, such that light emitted from the light emitter 200 passing through the first surface 110 shows a Gaussian light distribution with a peak at the optical axis P. However, as illustrated in FIG. 4A, when the protruder 300 is formed on the first surface 110, light emitted from the light emitter 200 shows a light distribution concaved at the optical axis P. Thus, for the optical lens 100 according to embodiments, a shape of the protruder 300 may allow various types of light distribution relative to an incident light.

For example, as illustrated in FIG. 5, the protruder 300 formed on the first surface 110 may be configured such that light reflected from the second surface 120 may be emitted by being refracted by the third surface 130 to have a path B cutting across through an upper surface of the optical lens 100, and such that light reflected from the third surface 130 may have a path B where the light is emitted in a lateral direction of the optical lens 100 by being refracted by the second surface 120.

Further, the protruder 300 may be adjusted to allow a ratio of light quantity of the light proceeding along the path A and a ratio of light quantity of the light proceeding along the path B to be in the range of approximately 4:1~1:4. That is, when the shape of the protruder 300 is changed, the light distribution inside the optical lens 100 may be changed to allow a ratio of light quantity in the range of approximately 4:1~1:4 to be changed using the shape of the protruder 300. For example, a shape of the protruder 300 where a light quantity ratio of approximately 4:1 between a light proceeding along the path A and a light proceeding along the path B, and a shape of the protruder 300 where the light quantity ratio is approximately 1:4 are different. Thus, the light quantity ratio between the light refracted by the second surface 120 by being reflected by the third surface 130 and the light refracted from the first surface 110 by being reflected from the second surface 120 may be in the range of approximately 4:1~1:4.

Figure 6A:
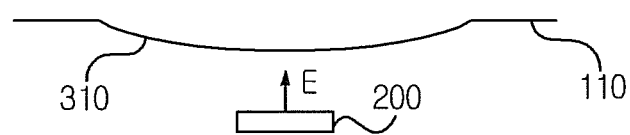
FIGS. 6A to 6F are schematic partial cross-sectional views illustrating a shape of a protruder according to embodiments.
Figure 6B:
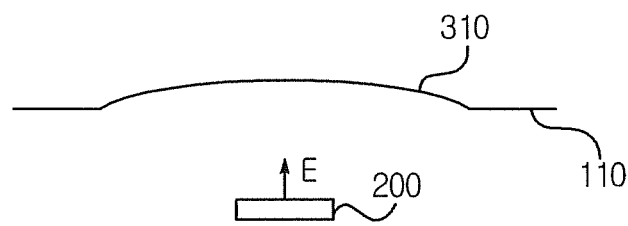
Figure 6C:
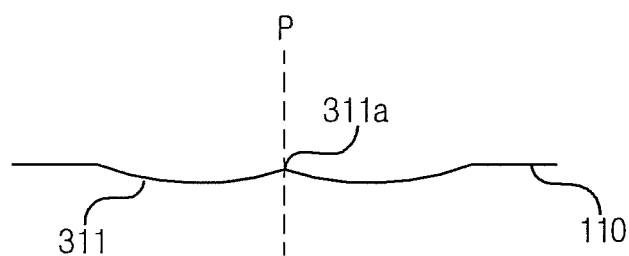

Next, a shape of the protruder 300 applied to the optical lens 100 according to the embodiments will be explained with reference to FIGS. 6A-6F. Referring to FIG. 6A, protruder 310 may be formed to have a shape that protrudes from the first surface 110 in a direction of the light emitter 200, a direction opposite to a direction in which light is incident. Alternatively, referring to FIG. 6B, protruder 310 may be formed to have a shape that protrudes from the first surface 110 in a direction of the light emitter 200, a direction in the light incident direction, that is, a shape concaved from the first surface 110. Further, at least one concave portion may be formed in the light incident direction on the protruder; that is, FIG. 6C illustrates a protruder 311 formed with a concave portion 311a, where a center of the concave portion 311a may correspond to the optical axis P.

Figure 6D:
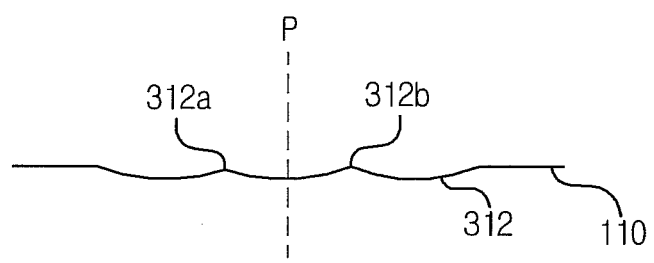
Figure 6E:
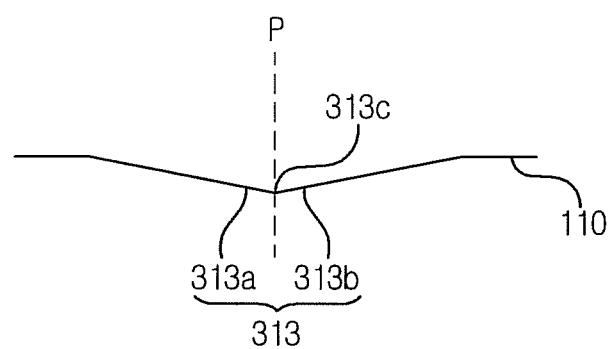
Figure 6F:
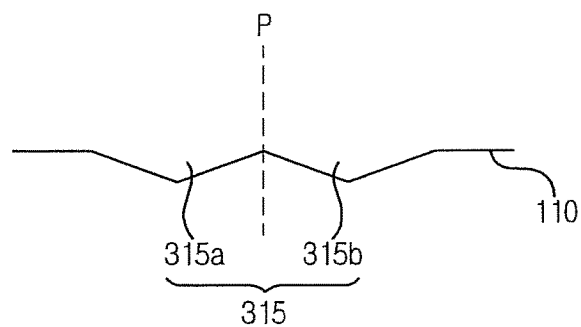

FIG. 6D illustrates a protruder 312 formed with two concave portions 312a, 312b, where the two concave portions 312a, 312b do not correspond to the optical axis P. In addition, although the protruders 310, 311, 312 of FIGS. 6A-6D may be formed with a curved shape, FIGS. 6E and 6F illustrate protruders 313, 315 having cross-sections with triangular shapes. That is, FIG. 6E illustrates a protruder having a cross-section having a triangular shape that protrudes from the first surface 110, formed by a first straight line 313a and a second straight line 313b on the cross-section, and a triangular apex 313c, where the first straight line 313a and the second straight line 313b meet at the optical axis P.

Further, FIG. 6F illustrates a protruder 315 formed by two protruder portions 315a, 315b, whose cross-sections are triangle and protrude from the first surface 110. The protruder according to embodiments may take a symmetrical shape relative to the optical axis P.

Figure 7:
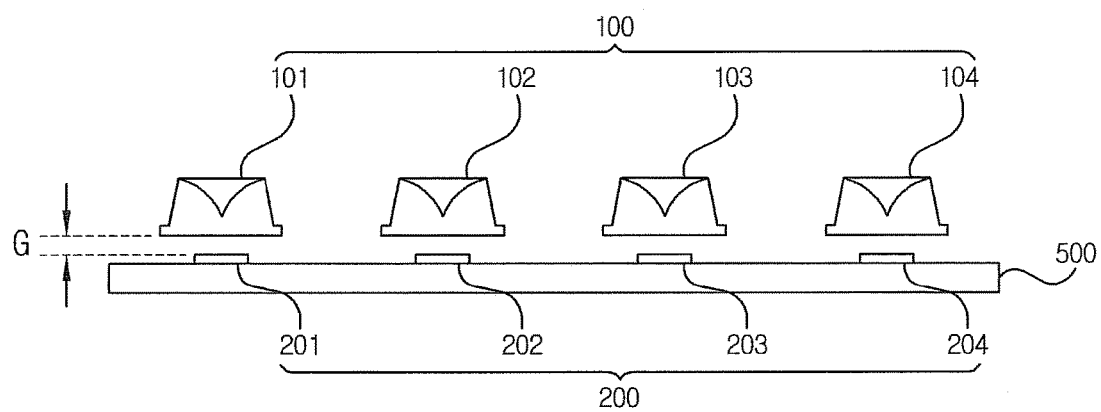
FIG. 7 is a schematic cross-sectional view of a light emitting device according to an embodiment.
Figure 8:
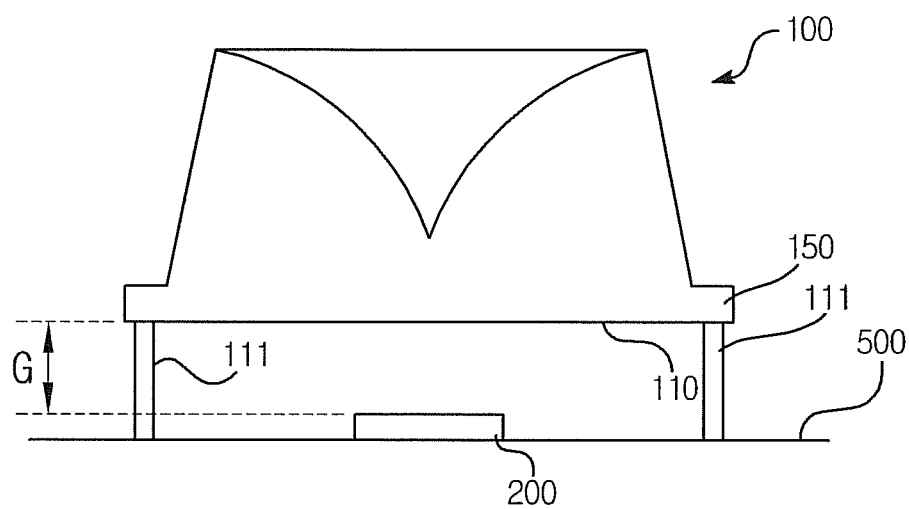
FIG. 8 is a schematic partial cross-sectional view of a light emitting device according to an embodiment.

FIG. 7 is a schematic cross-sectional view of a light emitting device according to an embodiment. FIG. 8 is a schematic partial cross-sectional of a light emitting device according to an embodiment.

The light emitting device according to an embodiment may include one or more optical lenses 100, a circuit substrate 500, and one or more light emitters 200. That is, the light emitting device according to an embodiment may include a circuit substrate 500, a plurality of light emitters 200 formed on the circuit substrate 500, and a plurality of optical lenses 100, each correspondingly arranged (assembled) with respect to one of the plurality of light emitters 200.

The circuit substrate 500 may be a long rectangular plate having a long side and a short side, and the plurality of light emitters 200 may be formed with or on a circuit pattern (not shown), which in turn may transmit a drive signal to the plurality of light emitters 200. Further, the plurality of the light emitters 200 may be electrically connected to the circuit pattern of the circuit substrate 500 to generate light using the drive signal applied to the circuit pattern.

The light generated by the plurality of light emitters 200 may have a light profile dispersed from approximately 360 degrees to a particular angle of beam spread. Further, the light generated by the plurality of light emitters 200 may have a characteristic of high luminance, but a light profile that is far deteriorated in luminance uniformity. In order to improve the luminance uniformity of the plurality of light emitters 200, each light emitter 200 may be arranged with an optical lens 100.

As discussed above, the optical lens 100 may include a first surface 110, a second surface 120, and a third surface 130. In order to more effectively diffuse the light generated by the light emitter 200, a portion of the light generated by the light emitter 200 may be reflected from the second surface 120 to the third surface 130 by being incident on the first surface 110, emitted outside of the optical lens 100 by being refracted by the third surface 130, and a portion of the light generated by the light emitter 200 may be reflected from the third surface 130 to the second surface 120, and emitted outside of the optical lens 100 by being refracted by the second surface 120.

As noted above, the light luminance uniformity may be greatly improved using the optical lens 100, a light profile having a high luminance and high luminance uniformity may be formed using a lesser number of light emitters 200, and electric power consumption may be greatly reduced. Further, the optical lens 100 may be spaced apart from the light emitter 200 at a predetermined distance (G) according to embodiments disclosed herein.

The plurality of light emitters 200 may be arranged on the circuit substrate 500 in the light emitting device according to embodiments, and each of the plurality of light emitters 200 may be assembled with or provided with one of the optical lens 100.

As illustrated in FIG. 7, a plurality of light emitters 201, 202, 203, 204 may be arranged on the circuit substrate 500, where, although each of the plurality of light emitters 201, 202, 203, 204 is the same in light emitting luminance and distribution of emitted light, the light emitting luminance and distribution of emitted light in the light emitting device may be changed or different. Hence, the luminance and distribution of light emitted from the optical lenses 101, 102, 103, 104 assembled on or provided with respect to each of the plurality of light emitters 201, 202, 203, 204 may be differently designed, and the plurality of light emitters 201, 202, 203, 204 may be designed to emit light along mutually different paths.

The luminance and the light distribution emitted from the optical lenses 101, 102, 103, 104 may be the same. As a result, a light quantity ratio of light refracted by the second surface 120 by being reflected from the third surface of the optical lens and that of the light quantity ratio of light reflected from the second surface 120 by being refracted by the third surface 130 may be different in the optical lens 101, 102, 103, 104. The light quantity ratio may be approximately 4:1~1:4 as discussed above.

In addition, the optical lenses 101, 102, 103, 104 may be assembled or provided on the circuit substrate 500 corresponding to the plurality of light emitters 200. As illustrated in FIG. 8, the optical lenses 101, 102, 103, 104 may be provided with a plurality of legs or supports 111, and the optical lenses 101, 102, 103, 104 may be mounted on the circuit substrate 500 using the plurality of supports 111. The plurality of supports 111 may extend from the flange 150 of the optical lens 100. Further, the plurality of supports 111 may be provided along a circumferential direction of the flange 150.

Figure 9:
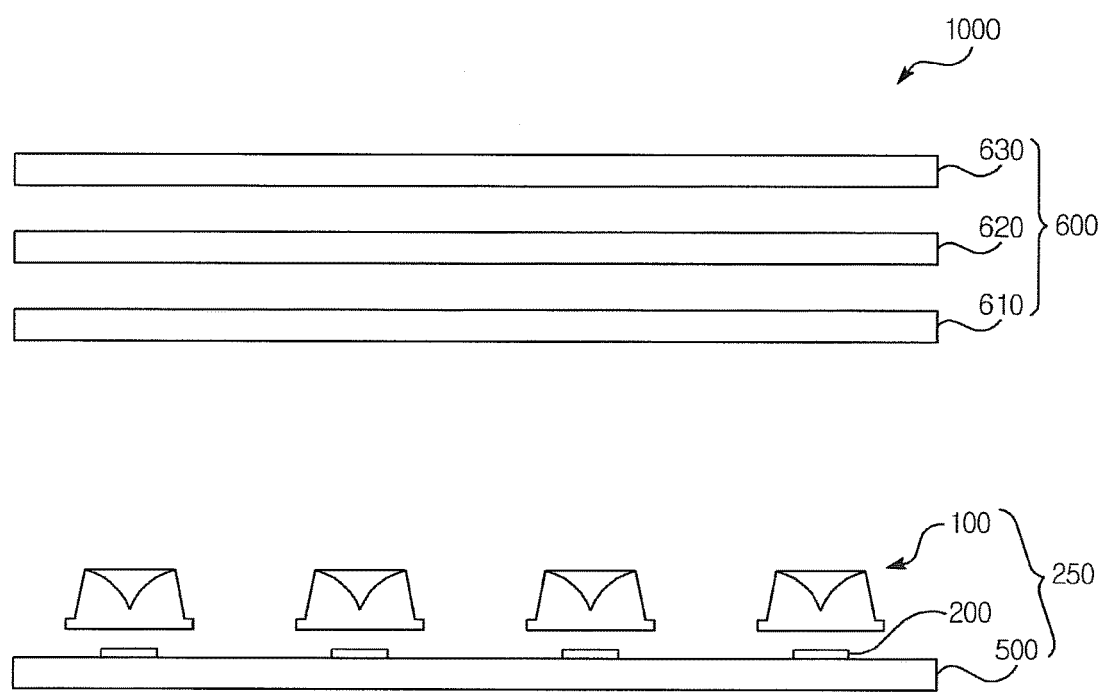
FIG. 9 is a schematic view of a lighting device according to an embodiment.

FIG. 9 is a schematic view of a lighting device according to another embodiment. The light emitting device of FIGS. 7-8 may be utilized in the lighting device or back light of FIG. 9 and may be substantially the same in configuration as that illustrated in FIGS. 7-8. Thus, repetitive disclosure has been omitted and like reference numerals designate like elements.

Referring to FIG. 9, the lighting device or back light 1000 may include a light emitting device 250 and one or more optical sheets 600. The one or more optical sheets 600 may be a general configuration forming a display or back light, and explanation thereto has been omitted. For example, the optical sheets 600 may be formed with a plurality of optical films 610, 620, 630 including a diffusion film. Further, the one or more optical sheets 600 may be arranged on the light emitting device 250.

In addition, the lighting device according to an embodiment may include a bottom case (not shown) and a reflective plate (not shown). For example, the bottom case may be arranged at a floor plate with the reflective plate, where the reflective plate functions to reflect the light emitted by the optical lenses 100 of the light emitting device 250.

Embodiments disclosed herein form a broader luminance surface by reducing a width of an angle of beam spread and improving uniformity of the illumination surface.

Embodiments disclosed herein provide a light diffusion device or optical lens that may include a first surface; a second surface disposed over the first surface; a third surface concaved with respect to the second surface towards the first surface, wherein the third surface converges toward a center thereof with a curved shape, and wherein a predetermined distance is provided between the third surface and the first surface along an optical axis, which is a straight line that passes through the center of the third surface and a center of the first surface; a protruder centrally arranged with respect to the first surface and that protrudes in a first direction along the optical axis, wherein a cross-section of the protruder taken along the optical axis includes two curved portions that each curve in the first direction and then curve in a second direction opposite to the first direction to substantially meet at the optical axis; and a plurality of supports that extend from the first surface in the first direction, and configured to provide a space below the protruder, wherein the plurality of supports is provided adjacent to the protruder.

The optical lens may include a flange that extends from the first surface. The plurality of supports may be provided along a circumferential direction of the flange.

Light reflected from the second lens surface by being incident through the first lens surface may be emitted by being refracted from the third lens surface. Light reflected from the third lens surface by being incident through the first lens surface may be emitted by being refracted from the second lens surface. An angle (θ) formed between an extended line of light emitted by being refracted from the second lens surface and light emitted by being refracted from the third lens surface may be an acute angle. The angle (θ) may be within approximately 20 degrees.

A light quantity ratio between the light refracted from or by the second lens surface and the light refracted from or by the third lens surface may be in the range of approximately 4:1~1:4. A path of the light refracted from the second lens surface and a path of the light refracted from or by the third lens surface may be mutually opposite in direction.

The protruder may be symmetrical with respect to the optical axis.

The second lens surface may be planar. The second lens surface may be curved. The second surface may be slanted toward the optical axis, as it extends away from the first surface.

An angle formed by the first lens surface and the second lens surface may be an acute angle.

The plurality of supports may extend substantially parallel to the optical axis. Further, the protruder may be inwardly recessed by a predetermined amount at the optical axis. A central axis of the protruder and a central axis of the third surface may be located on the optical axis.

The third surface may be convex with respect to a straight line that passes through a center of the third surface and an outer edge of the third surface. Also, the plurality of supports may be disposed adjacent a circumferential edge of the first surface.

Embodiments disclosed herein provide a light emitting device array unit or light emitting device that may include a substrate; a plurality of light emitters disposed on the substrate; and a plurality of optical lenses, each correspondingly arranged adjacent to one of the plurality of light emitters, wherein the plurality of optical lenses each comprises: a first surface; a second surface disposed over the first surface; a third surface concaved with respect to the second surface towards the first surface, wherein the third surface converges toward a center thereof with a curved shape, and wherein a predetermined distance is provided between the third surface and the first surface along an optical axis, which is a straight line that passes through the center of the third surface and a center of the first surface; a protruder centrally arranged with respect to the first surface and that protrudes in a first direction along the optical axis, wherein a cross-section of the protruder taken along the optical axis includes two curved portions that each curve in the first direction and then curve in a second direction opposite to the first direction to substantially meet at the optical axis; and a plurality of supports that extend from the first surface in the first direction, and configured to provide a space below the protruder, wherein the plurality of supports is provided adjacent to the protruder.

The light emitting device may include a flange that extends from the first surface. The plurality of supports may be provided along a circumferential direction of the flange.

The light diffusion device may be configured such that light reflected from the second lens surface by being incident through the first lens surface is emitted by being refracted from or by the third lens surface. Light reflected from the third lens surface by being incident through the first lens surface is emitted by being refracted from or by the second lens surface. An angle (θ) formed between an extended line of light emitted by being refracted from or by the second lens surface and light emitted by being refracted from or by the third lens surface is an acute angle. The angle (θ) may be within approximately 20 degrees.

Each of the plurality of optical lenses may have a different emitting luminance and a different emitting light distribution. Each of the plurality of light diffusion devices may have a same emitting luminance and a same emitting light distribution. A path of the light refracted from or by the second lens surface and a path of the light refracted from or by the third lens surface may be mutually opposite in direction.

The protruder may be inwardly recessed by a predetermined amount at the optical axis. A central axis of the protruder and a central axis of the third surface may be located on the optical axis.

The third surface may be convex with respect to a straight line that passes through a center of the third surface and an outer edge of the third surface. The plurality of supports may be disposed adjacent a circumferential edge of the first surface.

Embodiments disclosed herein further provide a lighting device that may include one or more optical sheets; a light emitting device disposed adjacent to the one or more optical sheets, wherein the light emitting device comprises: a substrate; a plurality of light emitters disposed on the substrate; and a plurality of optical lenses, each correspondingly arranged adjacent to one of the plurality of light emitters, wherein the plurality of optical lenses each comprises: a first surface; a second surface disposed over the first surface; a third surface concaved with respect to the second surface towards the first surface, wherein the third surface converges toward a center thereof with a curved shape, and wherein a predetermined distance is provided between the third surface and the first surface along an optical axis, which is a straight line that passes through the center of the third surface and a center of the first surface; a protruder centrally arranged with respect to the first surface and that protrudes in a first direction along the optical axis, wherein a cross-section of the protruder taken along the optical axis includes two curved portions that each curve in the first direction and then curve in a second direction opposite the first direction to substantially meet at the optical axis; and a plurality of supports that extend from the first surface in the first direction, and configured to provide a space below the protruder, wherein the plurality of supports is provided adjacent the protruder. The lighting device may further include a flange that extends from the first surface. The plurality of supports may be provided along a circumferential direction of the flange. The one or more optical sheets may include a plurality of optical films. The plurality of optical films may include a diffusion film. Further, the lighting device may be a backlight.

Although a number of illustrative embodiments have been described, it should be understood that numerous other modifications and embodiments may be devised by those skilled in the art that will fall within the spirit and scope of the principles of this disclosure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a substrate;
    a plurality of light emitters provided on the substrate; and
    a plurality of optical lenses, each correspondingly arranged with respect to one of the plurality of light emitters, wherein each of the plurality of optical lenses includes:
        a first surface that extends linearly in a first direction perpendicular to an optical axis and having a flat face toward the light emitter;
        a second surface connected to the first surface, wherein the second surface is slanted toward the optical axis as the second surface extends away from the first surface and having a flat face;
        a third surface concaved with respect to the second surface toward the first surface, wherein the third surface converges in a curved shape symmetrically toward the optical axis to form a center, and wherein a predetermined distance is provided between the third surface and the first surface along the optical axis;
        a flange formed between the first surface and the second surface and including a fourth surface that extends from the first surface parallel to the optical axis beyond the second surface and a fifth surface that extends from the fourth surface toward the second surface;
        a protruder centrally arranged on the flat face of the first surface and formed to protrude from the first surface along the optical axis in a second direction toward a corresponding one of the plurality of light emitters, which is provided below the first surface and spaced apart therefrom, wherein the protruder includes at least one concave portion, a center of which is substantially coincident with a center of the corresponding one of the plurality of light emitters; and
        a plurality of supports discretely formed below the first surface and provided along a circumferential direction of the flange, and configured to provide a space below the protruder to accommodate the corresponding one of the plurality of light emitters therein, wherein the center of the third surface coincides with the center of the corresponding one of the plurality of light emitters, wherein a diameter of the protruder is smaller than a width D of the optical lens and a depth d of the center of the protruder is smaller than a height of the flange, and wherein the flat face of the first surface is arranged parallel to an upper surface of the substrate, and the second surface is inclined at a predetermined angle relative to the first surface toward the optical axis to reduce a height and size of the optical lens and is configured to allow a portion of the light received from the first surface to be reflected from the second surface to improve luminance uniformity of the light.

2. The light emitting device of claim 1, wherein the plurality of supports is provided along a circumferential direction of an edge of the first surface.

3. The light emitting device of claim 1, wherein light reflected from the second surface after being incident on the first surface is emitted by being refracted by the third surface, light reflected from the third surface after being incident on the first surface is emitted by being refracted by the second surface, and an angle formed between an extended line of light emitted by being refracted by the second surface and light emitted by being refracted by the third surface is an acute angle.

4. The light emitting device of claim 3, wherein the angle is within approximately 20 degrees.

5. The light emitting device of claim 1, wherein the protruder is substantially symmetrical with respect to the center of the corresponding one of the plurality of light emitters.

6. The light emitting device of claim 1, wherein a cross-section of the protruder is substantially symmetrical with respect to the center of the corresponding one of the plurality of light emitters.

7. The light emitting device of claim 1, wherein a central axis of the protruder and a central axis of the third surface are located substantially on the center of the corresponding one of the plurality of light emitters.

8. The light emitting device of claim 1, wherein the third surface is convex with respect to straight lines that pass through a center of the third surface and an outer edge of the third surface.

9. A lighting device, comprising:
    one or more optical sheets;
    a light emitting device provided adjacent to the one or more optical sheets, wherein the light emitting device includes:
        a substrate;

a plurality of light emitters provided on the substrate; and a plurality of optical lenses, each correspondingly arranged adjacent to one of the plurality of light emitters, wherein the plurality of optical lenses each includes:

a first surface that extends linearly in a first direction perpendicular to an optical axis and having a flat face toward the light emitter;

a second surface connected to the first surface, wherein the second surface is slanted toward the optical axis as the second surface extends away from the first surface and having a flat face;

a third surface concaved with respect to the second surface toward the first surface, wherein the third surface converges in a curved shape symmetrically toward the optical axis to form a enter, and wherein a predetermined distance is provided between the third surface and the first surface along the optical axis;

a flange formed between the first surface and the second surface and including a fourth surface that extends from the first surface parallel to the optical axis beyond the second surface and a fifth surface that extends from the fourth surface toward the second surface;

a protruder centrally arranged on the first surface and formed to protrude from the first surface along the optical axis in a second direction toward a corresponding one of the plurality of light emitters, which is provided below the first surface and spaced apart therefrom, wherein the protruder includes at least one concave portion, a center of which is substantially coincident with a center of the corresponding one of the plurality of light emitters; and a plurality of supports discretely formed below the first surface and provided along a circumferential direction of the flange, and configured to provide a space below the protruder to accommodate the corresponding one of the plurality of light emitters therein, wherein the center of the third surface coincides with the center of the corresponding one of the plurality of light emitters, wherein a diameter of the protruder is smaller than a width D of the optical lens and a depth d of the center of the protruder is smaller than a height of the flange, and wherein the flat face of the first surface is arranged parallel to an upper surface of the substrate, and the second surface is inclined at a predetermined angle relative to the first surface toward the optical axis to reduce a height and size of the optical lens and is configured to allow a portion of the light received from the first surface to be reflected from the second surface to improve luminance uniformity of the light.

10. The lighting device of claim 9, wherein the plurality of supports is provided along a circumferential direction of an edge of the first surface.

11. The lighting device of claim 9, wherein the one or more optical sheets includes a plurality of optical films.

12. The lighting device of claim 11, wherein the plurality of optical films includes a diffusion film.

13. The lighting device of claim 9, wherein the lighting device is a backlight.

14. The lighting device of claim 1, wherein a light quantity ratio between the light refracted from the second surface and the light refracted from the third surface is in a range of 1:4~4:1.

15. The lighting device of claim 9, wherein a light quantity ratio between the light refracted from the second surface and the light refracted from the third surface is in a range of 1:4~4:1.

* * * * *